United States Patent [19]
Mochizuki et al.

[11] Patent Number: 5,381,131
[45] Date of Patent: Jan. 10, 1995

[54] SMOKE DETECTING APPARATUS FOR FIRE ALARM

[75] Inventors: Mikio Mochizuki; Hideo Ito; Ryousaku Kobayashi, all of Chiyoda, Japan

[73] Assignee: Nohmi Bosai Ltd., Tokyo, Japan

[21] Appl. No.: 82,856

[22] Filed: Jun. 28, 1993

[30] Foreign Application Priority Data

Jun. 29, 1992 [JP] Japan .................. 4-194730
Jun. 30, 1992 [JP] Japan .................. 4-196506

[51] Int. Cl.⁶ ............................................. G08B 17/10
[52] U.S. Cl. ................................ 340/630; 340/628; 340/635
[58] Field of Search ............... 340/628, 629, 630, 635, 340/641; 356/439; 250/574

[56] References Cited

U.S. PATENT DOCUMENTS

| | | | |
|---|---|---|---|
| 3,866,195 | 2/1975 | Ried, Jr. ................. | 340/629 |
| 3,881,112 | 4/1975 | Roberts ................... | 250/565 |
| 4,097,850 | 6/1978 | Conforti .................. | 340/514 |
| 4,193,069 | 3/1980 | Cooper et al. .......... | 340/630 |
| 4,321,595 | 3/1982 | Tresch ..................... | 340/630 |
| 4,524,351 | 6/1995 | Kimura et al. .......... | 340/629 |
| 4,638,304 | 1/1987 | Kimura et al. .......... | 340/630 X |
| 4,651,013 | 3/1987 | Kajii et al. .............. | 340/630 X |
| 4,670,741 | 6/1987 | Cole ........................ | 340/630 |
| 4,757,306 | 7/1988 | Kimura .................... | 340/630 |
| 4,827,247 | 5/1989 | Giffone ................... | 340/630 |
| 4,831,564 | 5/1989 | Suga . | |
| 4,990,895 | 2/1991 | Juds ........................ | 340/635 |

FOREIGN PATENT DOCUMENTS

0079010 5/1983 European Pat. Off. .

Primary Examiner—Jeffery A. Hofsass
Attorney, Agent, or Firm—Wenderoth, Lind & Ponack

[57] ABSTRACT

A smoke detecting apparatus includes a lamp, a light receiving element for receiving light from the lamp, and a smoke detecting circuit for detecting the smoke density in accordance with the signal outputted from the light receiving element. The apparatus further includes a light emission failure detector and counter for detecting a light emission failure in which the lamp fails to emit light in response to a light emission instruction from the smoke detecting and counting light emission failures, and a memory for storing the number of light emission failures. The apparatus may further include a warning unit which, when the number of failures becomes a predetermined value or more, warns that the lamp will soon be exhausted. Thus, the unit enables a maintenance person to replace the lamp without fail before it is exhausted.

12 Claims, 7 Drawing Sheets

FIG. 3

DATA STORED IN EEPROM 63

| MONTH AFTER INSTALLATION | NUMBER OF LIGHT EMISSION FAILURES |
|---|---|
| FIRST MONTH | 0 |
| SECOND MONTH | 0 |
| THIRD MONTH | 0 |
| FOURTH MONTH | 0 |
| FIFTH MONTH | 0 |
| SIXTH MONTH | 0 |
| SEVENTH MONTH | 1 |
| EIGHTH MONTH | 1 |
| NINTH MONTH | 3 |
| TENTH MONTH | 2 |
| ELEVENTH MONTH | 3 |
| TWELFTH MONTH | 5 |
| THIRTEENTH MONTH | 10 |

SMOKE DETECTING APPARATUS FOR FIRE ALARM

BACKGROUND OF THE INVENTION

1. Field of the Invention

The present invention relates to a smoke detecting apparatus for a fire alarm which includes a light emitting lamp, such as a xenon lamp, and a light receiving element provided in a smoke chamber so as to detect the smoke density in the smoke chamber in accordance with an output signal of the light receiving element upon receiving light emitted from the light emitting lamp and scattered by the smoke inside the smoke chamber.

2. Description of the Related Art

A conventional smoke detecting apparatus, which detects the smoke density in the smoke chamber in accordance with an output signal of a light receiving element upon receiving light from a xenon lamp, is unable to operate normally after a certain length of service because the xenon lamp loses its light emitting efficiency or is no longer able to emit light at all after a certain number of service years or a certain number of light emissions.

To detect the failure of the xenon lamp, the known smoke detecting apparatus monitors the reception level of the light from the xenon lamp. When the reception level falls below a predetermined level, the apparatus determines that the xenon lamp has failed. More specifically, when no reception above a predetermined level has been detected in a predetermined length of time, for example, 30 or 60 seconds, the apparatus determines that the xenon lamp has failed, and indicates the failure of the xenon lamp by, for example, producing an audible-alarm.

Although the conventional apparatus is able to indicate that the xenon lamp has failed, it is unable to predict the lamp failure. Therefore, when the xenon lamp of the conventional smoke detecting apparatus has failed, the smoke detecting apparatus remains out of operation for some time before a maintenance person notices the failure and replaces the xenon lamp. Such an inoperative period is undesirable. Other types of smoke detecting apparatuses employing light emitting lamps other than the xenon lamp are also subject to the same problem.

SUMMARY OF THE INVENTION

Accordingly, an object of the present invention is to provide a smoke detecting apparatus for a fire alarm which predicts and indicates that the light emitting lamp will soon be exhausted, thereby eliminating the inoperative period.

To achieve the above objects, according to a first aspect of the present invention, there is provided a smoke detecting apparatus for a fire alarm comprising: a lamp for emitting light; a light receiving element for receiving light from the lamp; a smoke detecting circuit for detecting the smoke density in accordance with the signal outputted from the light receiving element; light emission failure detecting means for detecting a light emission failure in case the lamp fails to emit light in response to a light emission instruction from the smoke detecting circuit; counter means for counting the number of light emission failures; and storage means for storing the number of light emission failures.

According to a second aspect of the present invention, there is provided a smoke detecting apparatus for a fire alarm further comprising lamp exhaustion warning means for, when the number of light emission failures stored in the storage means has reached a predetermined value, issuing a warning that the lamp will soon be exhausted.

Because the smoke detecting apparatus for a fire alarm according to the first aspect of the present invention comprises the light emission failure detecting means and the storage means for storing the number of light emission failures, the data stored in the storage means is indicative as to whether the lamp will soon be exhausted, and thus enables a maintenance person to replace the lamp without fail before the lamp is exhausted.

Further, because the smoke detecting apparatus for a fire alarm according to the second aspect of the present invention further comprises the lamp exhaustion warning means, the smoke detecting apparatus automatically produces an alarm when it determines that the lamp will soon be exhausted, thus prompting a maintenance person to replace the lamp before it is actually exhausted.

BRIEF DESCRIPTION OF THE DRAWINGS

FIG. 3 shows an example denoting data of the number of light emission failures stored in the EEPROM in the smoke detecting apparatus shown in FIG. 1.

DESCRIPTION OF THE PREFERRED EMBODIMENTS

[Embodiment 1]

A smoke detecting apparatus for a fire alarm according to Embodiment 1 of the present invention will be described hereinafter with reference to FIGS. 1 to 3.

Figure 1:
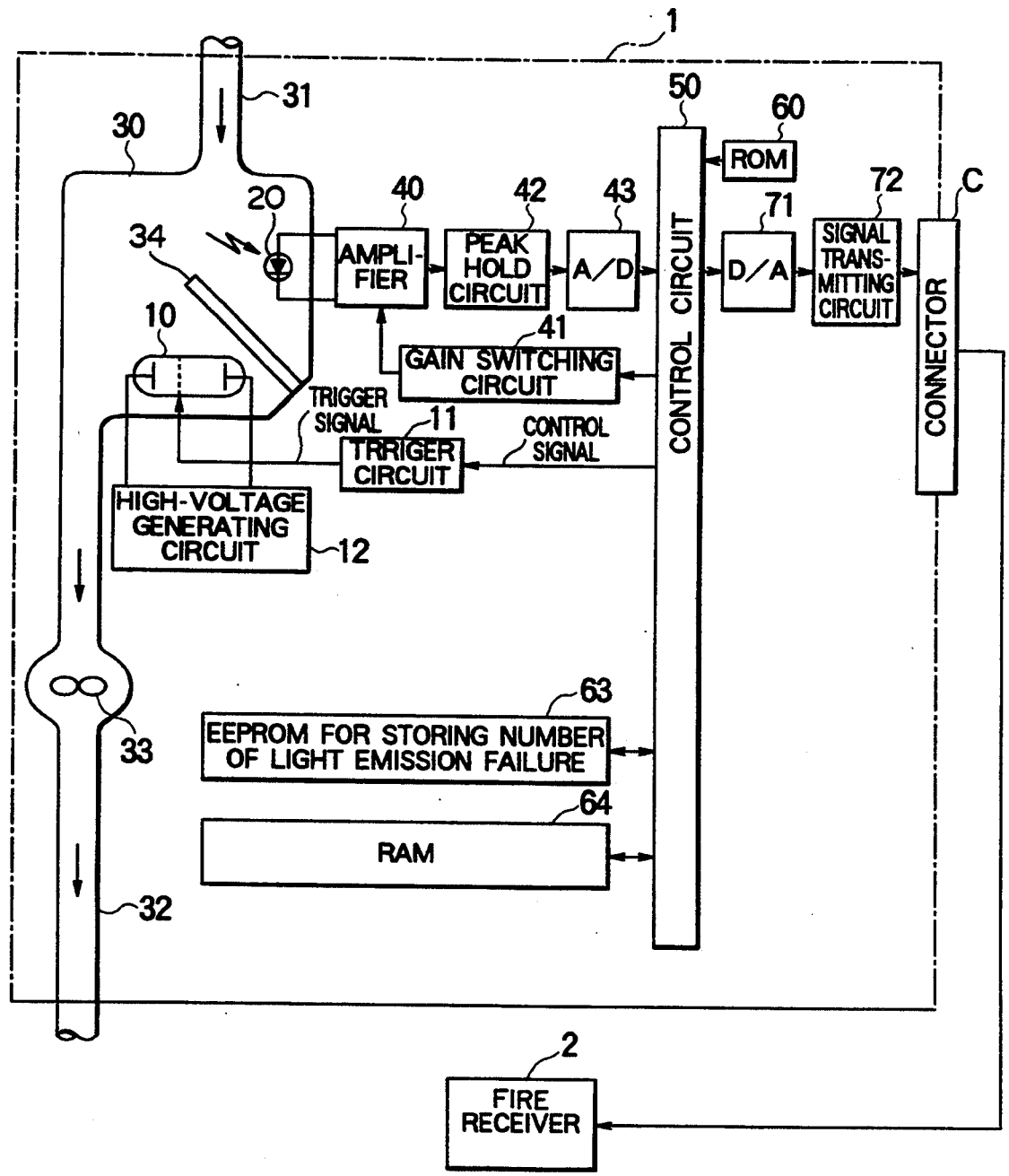
FIG. 1 is a block diagram of a smoke detecting apparatus according to Embodiment 1 of the present invention.

Referring to FIG. 1, a smoke detector 1 has a smoke chamber 30 containing a xenon lamp 10, a light receiving element 20 and a light shielding plate 34 separating the xenon lamp 10 and the light receiving element 20 from each other. The light from the xenon lamp 10 is scattered by smoke in the smoke chamber 30, and light thus scattered is received by the light receiving element 20. A control circuit 50 determines the smoke density in the smoke chamber 30 in accordance with the amount of the light received by the light receiving element 20.

The xenon lamp 10 is supplied with a high voltage required for light emission from a high-voltage generating circuit 12. The light emission timing of the xenon lamp 10 is controlled by a trigger signal from a trigger circuit 11. The trigger circuit 11 generates the trigger signal based on a control signal from the control circuit 50.

The smoke chamber 30 is connected to a sampling pipe 31 for introducing the atmosphere around the smoke detector 1 into the smoke chamber 30, and also connected to a pipe 32 for leading air from the smoke chamber 30 to the outside of the smoke detector 1. An aspiration fan 33 is provided in the pipe 32.

An amplifier 40 is connected to the light receiving element 20 and amplifies the output signal from the light receiving element 20. The gain of the amplifier 40 is controlled by a gain switching circuit 41. A peak hold circuit 42 holds a peak value of the output signal from the amplifier 40. An A/D converting circuit 43 converts the analog signal from the peak hold circuit 42 into a digital signal.

The control circuit 50 controls the overall operation of the smoke detector 1 and, further, determines the current smoke density in the smoke chamber 30 on the basis of the digital signal from the A/D converting circuit 43. The control circuit 50 is composed of, for example, a microcomputer.

Figure 2:
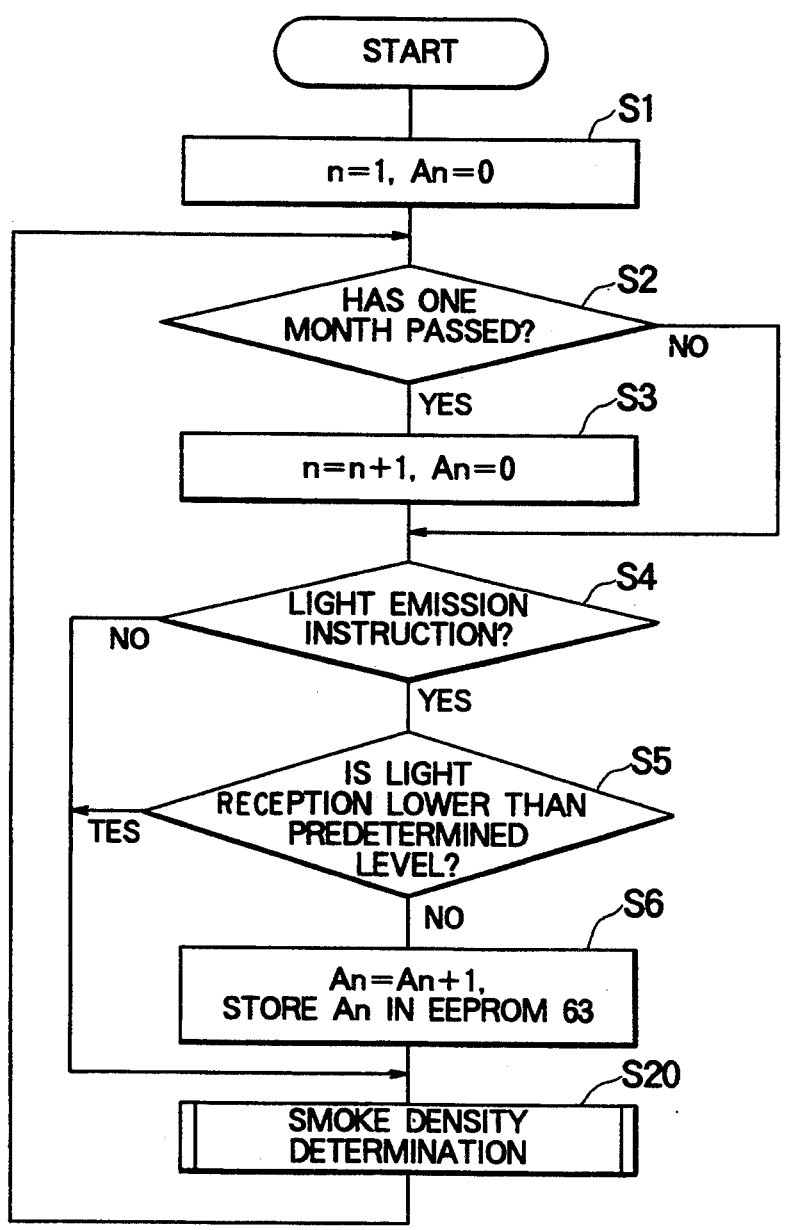
FIG. 2 is a flowchart of the operation of the smoke detecting apparatus shown in FIG. 1.

A ROM (read only memory) 60 stores a program corresponding to the flowchart is shown in FIG. 2. An EEPROM (electrically erasable and programmable ROM) 63 is a ROM for storing the number of incidences in which the xenon lamp 10 fails to emit light when it is supposed to do so (the number of light emission failures) in each month. A RAM (random access memory) 64 is a working memory.

A D/A converting circuit 71 converts the digital signal from the control circuit 50 into an analog signal, which is sent to a fire receiver 2 via a signal transmitting circuit 72 and a connector C.

A combination of the light receiving element 20, the control circuit 50 and the ROM 60 is an example of the combination of a light emission failure detecting and counting means for detecting the light emission failure of a light emitting lamp when an instruction for light emission is outputted, by monitoring the output of the light emission instruction from the control circuit 50 and light emission performed by the light emitting lamp 20, and counting the number of light emission failures. The light emission failure detecting and counting means determines that the lamp has failed to emit light when a light emission instruction has been outputted from the control circuit 50 and the light receiving element 20 does not detect light. The EEPROM 63 is an example of storing means for storing the number of light emission failures in a predetermined period. The EEPROM 63 is also an example of nonvolatile storing means which can be electrically rewritten.

The operation of Embodiment 1 will be described with reference to FIG. 2.

This embodiment stores the number of failures of the xenon lamp 10 to emit light when it is supposed to emit light, that is, the number of light emission failures, in each month. The light emission failure detecting and counting means starts counting light emission failures for the first month after the smoke detector 1 has been installed or after the xenon lamp 10 has been replaced. Therefore, when the smoke detector 1 has been installed or when the xenon lamp 10 has been replaced, the variable n representing the month is set to "1" and the function An representing the number of light emission failures in the month n is reset to "0" in Step S1. After that, every time a month has passed from the last setting (Step S2), the variable n is increased by 1 and the function An representing the number of emission failures for the new month is reset to "0" in Step S3.

If the control circuit 50 outputs a light emission instruction (Step S4) and the level of the light received by the light receiving element 20 is lower than a predetermined level (Step S5), the number of light emission failures is increased by 1 in Step S6. More specifically, the function An representing the number of light emission failures in the current month is increased by 1, and the value of the function An is stored in the corresponding location of the EEPROM 63. The procedure from Step S2 to Step S6 is executed every time a light emission instruction is outputted.

Incidentally, if the xenon lamp 10 emits light when there is no smoke in the smoke chamber 30, the light receiving element 20 receives a low level of light. In such a case, the light emission failure detecting and counting means does not determine that the xenon lamp 10 has failed to normally emit light. More specifically, the above-mentioned predetermined level of light received by the light receiving element 20 is lower than the low level of light received by the light receiving element 20 in such a case. The predetermined level of light received by the light receiving element 20 is such a level that the light emission failure detecting and counting means can clearly determine that the xenon lamp 10 has failed to normally emit light.

In Step 20, the smoke detecting apparatus for a fire alarm performs smoke density determination. More specifically, smoke density is determined by the following procedure: the amplifier 40 amplifies the signal from the light receiving element 20; the peak hold circuit 42 holds the peak value of the amplified signal; the A/D converting circuit 43 converts the peak value into a digital signal; and the control circuit 50 determines the smoke density based on the digital signal. Then, the output from the control circuit 50 is converted by the D/A converting circuit 71 into an analog signal, which is sent to the fire receiver 2 via the signal transmitting circuit 72 and the connector C. The fire receiver 2 displays the smoke density thus determined.

FIG. 3 shows an example denoting data of the number of light emission failures stored in the EEPROM 63 according to Embodiment 1. In this example, no light emission failure occurs in the first six months, but light emission failures occur once in each of the seventh and eighth months and, beyond that, occur three times, twice, three times, five times and ten times in the ninth through thirteenth months, respectively. With reference to the data stored in the EEPROM 63, it can be determined whether the xenon lamp 10 currently used in the smoke detector 1 should be replaced. More specifically, because the number of light emission failures, in general, gradually increases and reaches a certain level before a xenon lamp is exhausted, the record of light emission failures of the xenon lamp indicates when it will be exhausted, and thereby it can be determined whether the xenon lamp 10 should be replaced at present.

[Embodiment 2]

A smoke detecting apparatus for a fire alarm according to Embodiment 2 produces an alarm signal indicating that the xenon lamp will soon be exhausted, when the number of light emission failures increases to a predetermined level or greater.

Figure 4:
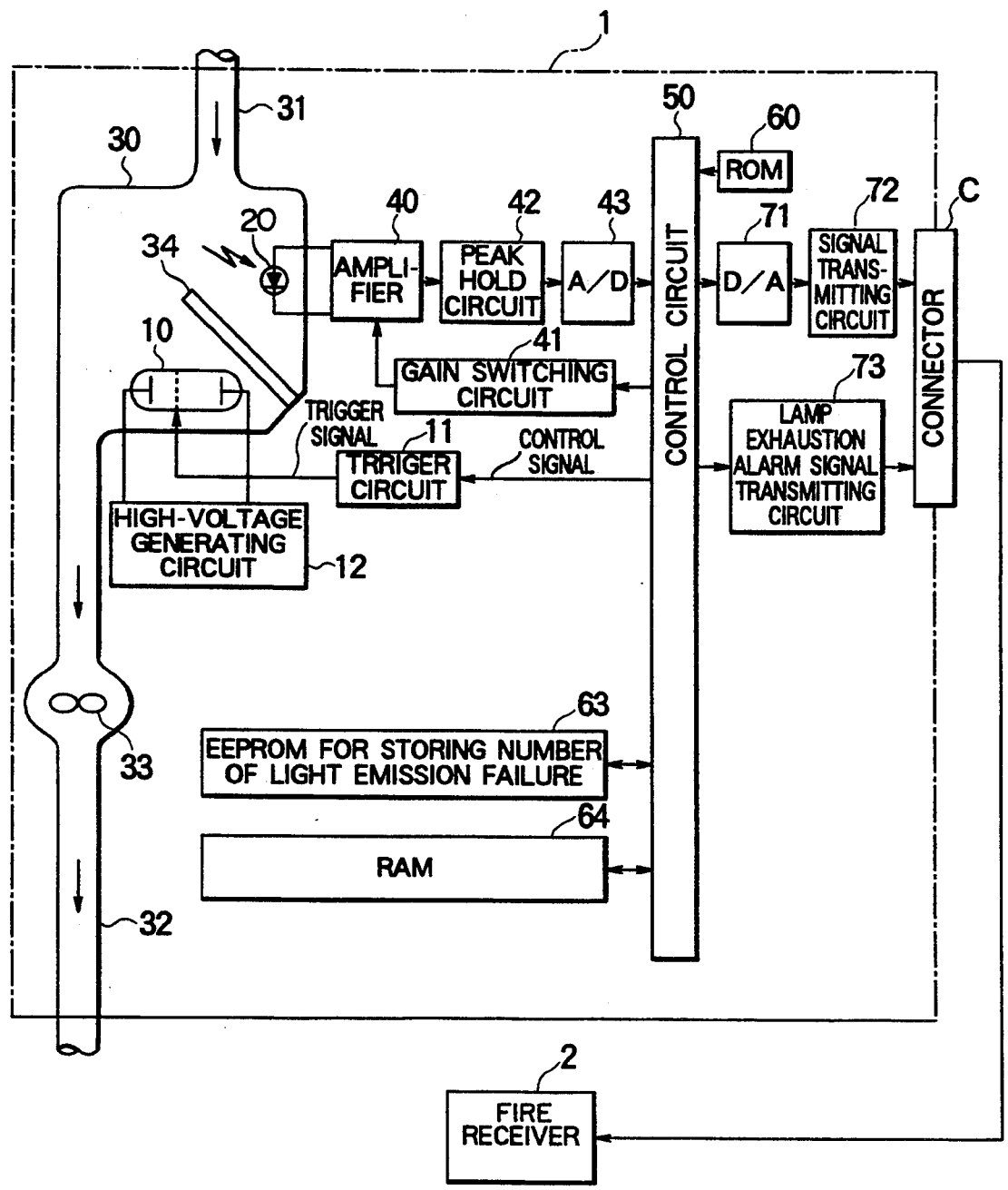
FIG. 4 is a block diagram of a smoke detecting apparatus according to Embodiment 2 of the present invention.

FIG. 4 is a block diagram of a smoke detecting apparatus for a fire alarm according to Embodiment 2. Components comparable to those in Embodiment 1 are denoted by the same numerals in FIG. 4 and will not be described again.

The smoke detector 1 according to this embodiment further comprises a lamp exhaustion alarm signal transmitting circuit 73 for outputting a lamp exhaustion alarm signal indicating that the xenon lamp 10 currently used will soon be exhausted. The control circuit 50 and ROM 60 form comparing means for comparing the current number of light emission failures with a predetermined number. Further, the control circuit 50, the ROM 60 and the lamp exhaustion alarm signal transmitting circuit 73 form lamp exhaustion warning means for warning that the light emitting lamp will soon be exhausted.

Figure 5:
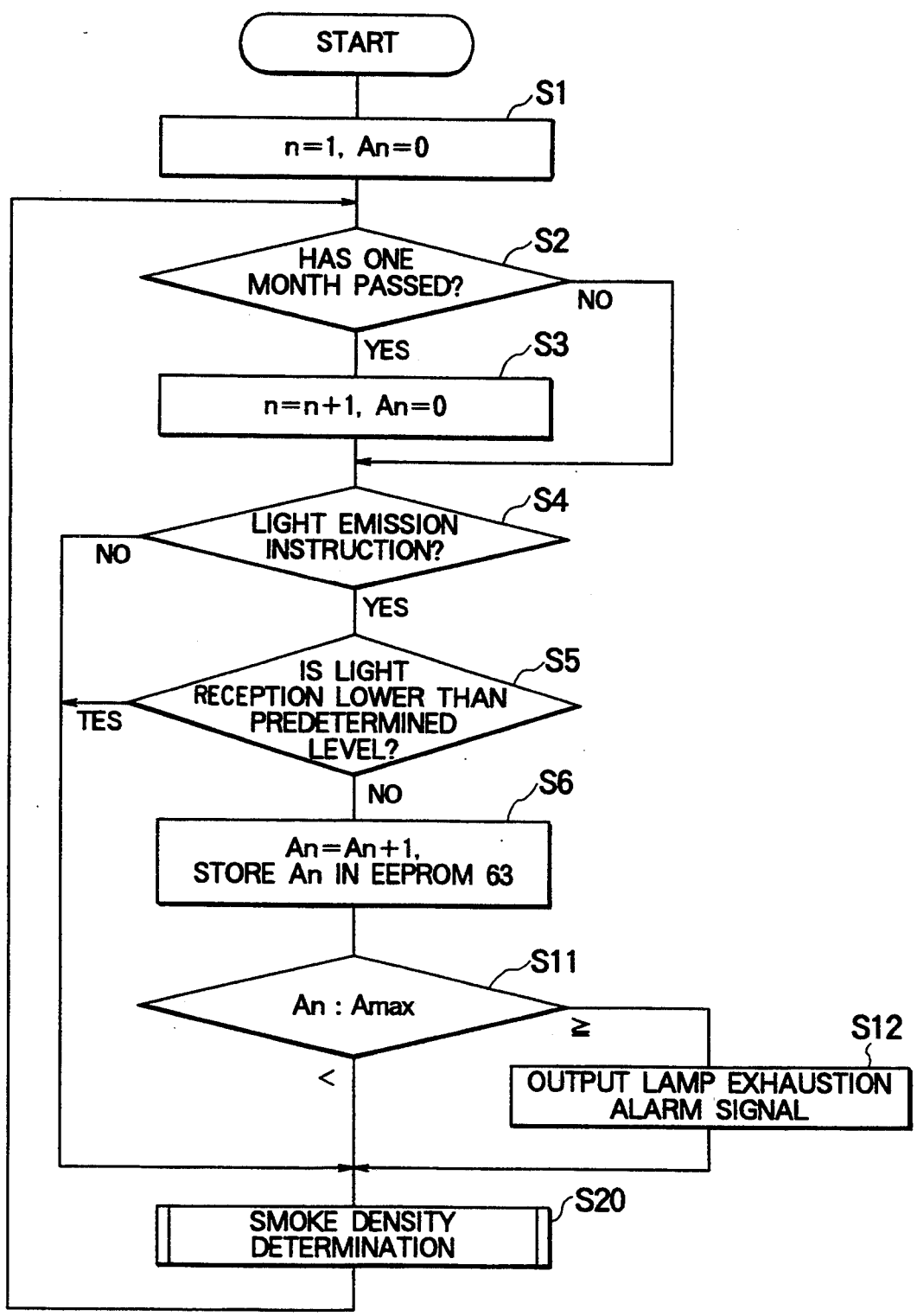
FIG. 5 is a flowchart of the operation of the smoke detecting apparatus shown in FIG. 4.

The operation of Embodiment 2 will be described with reference to the flowchart shown in FIG. 5.

The operation from Step S1 to Step S6 is the same as in Embodiment 1. According to Embodiment 2, after the number of light emission failures in the current month has been increased by 1 and the corresponding value has been stored in the corresponding location of the EEPROM 63 in Step S6, the control circuit 50 compares the value of the function An representing the number of light emission failures in the month with a predetermined alarm level Amax (e.g., seven in this embodiment) in Step S11. If the total number An of light emission failures in the month is seven or more, a lamp exhaustion alarm signal is outputted from the lamp exhaustion alarm signal transmitting circuit 73 in Step S12. The lamp exhaustion alarm signal is transmitted to the fire receiver 2 via the connector C. In response to the alarm signal, the receiver 2 produces an audible alarm. The operation from Step S2 through Step S12 is executed every time a light emission instruction is outputted. Then, the smoke density determination is performed in Step 20.

Thus, the smoke detector 1 according to Embodiment 2 outputs a lamp exhaustion alarm signal causing the fire receiver 2 to produce an alarm, if the number of light emission failures in the month is a predetermined number or more. Therefore, a maintenance person can be informed by the alarm that the xenon lamp 10 will soon be exhausted, without looking at the data stored in the EEPROM 63. The lamp exhaustion alarm may be produced by various means, for example audible means, such as a bell or recorded message, or visual means such as an indicator lamp or a display. Such alarm producing means may be provided in the smoke detector 1 instead of the receiver 2.

Figure 6:
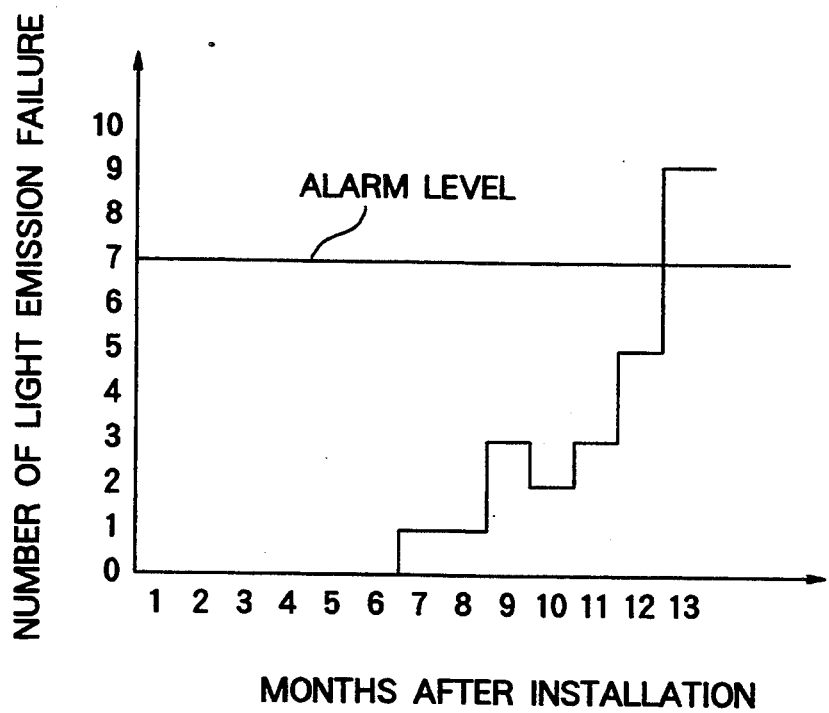
FIG. 6 indicates the relation between the alarm level and the numbers of light emission failures stored in the EEPROM according to the smoke detecting apparatus shown in FIG. 4.

FIG. 6 is a graph indicating the relation between the numbers of light emission failures in each month stored in the EEPROM 63 and the alarm level. Although the alarm level Amax is set to seven in this embodiment, it may be set to another value.

Further, although the above embodiments describe cases where the xenon lamp is used, the invention is also applicable using light emitting lamps other than the xenon lamp if they have an unstable failure mode.

[Embodiment 3]

Embodiment 3 further comprises a device provided specifically for detecting light emission failures, besides the light receiving element 20, while, in Embodiments 1 and 2, the light receiving element 20 is used to detect both the smoke density and a light emission failure of the lamp when a light emission instruction is outputted.

Figure 7:
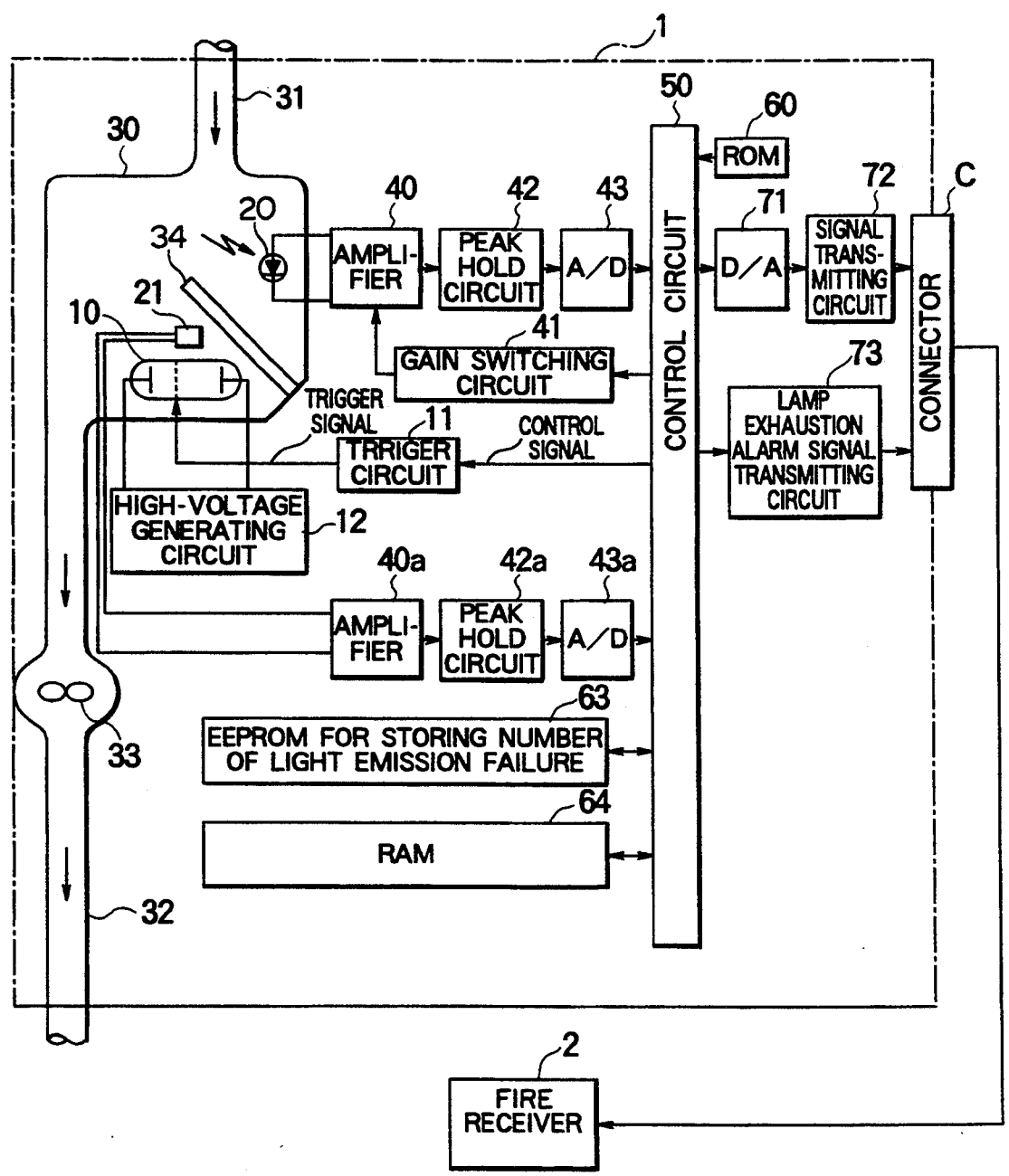
FIG. 7 is a block diagram of a smoke detecting apparatus according to Embodiment 3 of the present invention.

FIG. 7 illustrates a smoke detecting apparatus for a fire alarm according to Embodiment 3. Components comparable to those in Embodiments 2 and 3 are denoted by the same numerals in FIG. 7 and will not be described again.

Referring to FIG. 7, a light emission failure detecting element 21 is provided near the light emitting lamp 10 in the smoke chamber 30. Unlike the light receiving element 20, the light emission failure detecting element 21 is not separated from the light emitting lamp 10 by the light shielding plate 34. The light emission failure detecting element 21 may be a light receiving element or a thermo-sensitive element for detecting heat from the light emitting lamp 10. If the light emission failure detecting element 21 does not detect light emission when a light emission instruction has been outputted, it is determined that the lamp 10 has failed to emit light. FIG. 7 further shows: an amplifier 40a, a peak hold circuit 42a and an A/D converting circuit 43a for the light emission failure detecting element 21.

According to the present invention, changes in the output voltage or output electric current of the high-voltage generating circuit 12 may be monitored to detect a light emission failure. If the amount of the present change in the output voltage or output electric current of the high-voltage generating circuit 12 is smaller than the normal amount of change, it can be determined that the light emitting lamp has failed to emit light.

Although the control circuit 50 uses a light emission instruction output itself to determine a light emission failure in the above embodiments, it may use a control signal connected to the trigger circuit 11 or a trigger signal connected to the light emitting lamp to determine a light emission failure. Further, though the EEPROM 63 stores the number of light emission failures in each month according to the above embodiments, it may store the number of light emission failures in the unit of a predetermined length of time other than a month, for example, a week, 10 days, or 100 days. Still further, a RAM or a RAM with a back-up battery may be used instead of the EEPROM 63. Further, the smoke detecting apparatus for a fire alarm of the present invention may use a digital signal instead of the analog signal to send a signal indicating a smoke density to the fire receiver 2.

Although Embodiment 2 compares the number of light emission failures in each month with the alarm level Amax, a number obtained by adding some of the numbers stored in the EEPROM 63 may be compared with the alarm level Amax, for example, the total number of light emission failures in the past three months.

Although the storing means, such as the EEPROM, for storing the number of light emission failures, means for counting the number of light emission failures, and the comparing means for comparing the number of light emission failures with a predetermined value, are provided in the smoke detector 1 according to the above embodiments, these means may be provided in the fire receiver 2 or in a transmitter (not shown) or the like. In such a case, when the smoke detector 1 detects a light emission failure, the smoke detector 1 transmits a signal indicating that a light emission failure has occurred to the receiver 2 or the transmitter. If the fire receiver 2 or the transmitter is connected to a plurality of smoke detectors, the receiver 2 or the transmitter inputs the signal from each smoke detector 1 and stores them in the corresponding storing means respectively, which adds and stores the number of light emission failures of the smoke detector 1 for a unit of, for example, a month.

What is claimed is:

1. A smoke detecting apparatus comprising:

a lamp for emitting light;

a light receiving element for receiving light from said lamp and for generating a corresponding output signal;

a smoke detecting means, operatively coupled to said lamp and said light receiving element, for outputting a light emission instruction to said lamp to cause said lamp to emit light, and for receiving the output signal of said light receiving element and determining a smoke density in accordance with the output signal received from said light receiving element;

light emission failure detecting and counting means, operatively coupled to said smoke detecting means, for monitoring the light emission instruction from said smoke detecting means and a light emission of said lamp so as to detect a light emission failure in which said lamp fails to emit light in response to the light emission instruction from said smoke detecting means, and for counting the number of light emission failures; and storage means, operatively coupled to said light emission failure detecting and counting means, for storing the number of light emission failures counted by said light emission failure detecting and counting means in a predetermined period of time.

2. A smoke detecting apparatus as claimed in claim 1, wherein said light emission failure detecting and counting means determines that a light emission failure occurs when said smoke detecting means outputs a light emission instruction and said light receiving element does not detect a light emission corresponding to the light emission instruction.

3. A smoke detecting apparatus as claimed in claim 1, wherein said light emission failure detecting and counting means comprises a device provided specifically for detecting a light emission failure of said lamp, and wherein said light emission failure detecting and counting means determines that a light emission failure occurs when said smoke detecting means outputs a light emission instruction and the device provided specifically for detecting a light emission failure does not detect a light emission corresponding to the light emission instruction.

4. A smoke detecting apparatus as claimed in claim 3, wherein said device provided specifically for detecting a light emission includes one of a second light receiving element for detecting light from said lamp and a thermo-sensitive element for detecting heat from said lamp.

5. A smoke detecting apparatus as claimed in claim 1, wherein said smoke detecting means comprises: a control circuit for generating a control signal for controlling said lamp in response to the light emission instruction; and a trigger circuit, operatively coupled to said control circuit and said lamp, for outputting a trigger signal to said lamp in accordance with the control signal from the control circuit, and wherein said light emission failure detecting and counting means detects a light emission failure on the basis of at least one of the light emission instruction, the control signal outputted from the control circuit to the trigger circuit, and the trigger signal outputted from the trigger circuit to said lamp.

6. A smoke detecting apparatus as claimed in claim 1 wherein said storage means includes a nonvolatile storage which can be electrically rewritten.

7. A smoke detecting apparatus as claimed in claim 1, further comprising:

comparing means, operatively coupled to said storage means, for storing a predetermined value and comparing the number of light emission failures with a predetermined value so as to determine whether the number of light emission failures reaches the predetermined value; and lamp exhaustion warning means, operatively coupled to said comparing means, for issuing a warning indicative of exhaustion of said lamp when said comparing means determines that the number of light emission failures reaches the predetermined value.

8. A smoke detecting apparatus as claimed in claim 7, wherein said light emission failure detecting and counting means determines that a light emission failure occurs when said smoke detecting means outputs a light emission instruction and said light receiving element does not detect a light emission corresponding to the light emission instruction.

9. A smoke detecting apparatus as claimed in claim 7, wherein said light emission failure detecting and counting means comprises a device provided specifically for detecting a light emission failure of said lamp, and wherein said light emission failure detecting and counting means determines that a light emission failure occurs when said smoke detecting means has outputted the light emission instruction and said device provided specifically for detecting a light emission failure does not detect a light emission corresponding to the light emission instruction.

10. A smoke detecting apparatus as claimed in claim 9, wherein said device provided specifically for detecting a light emission includes one of a second light receiving element for detecting light from said lamp and a thermo-sensitive element for detecting heat from said lamp.

11. A smoke detecting apparatus as claimed in claim 7, wherein said smoke detecting means comprises: a control circuit for generating a control signal for controlling said lamp in response to the light emission instruction; and a trigger circuit, operatively coupled to said control circuit and said lamp, for outputting a trigger signal to said lamp in accordance with the control signal from the control circuit, and wherein said light emission failure detecting and counting means detects a light emission failure on the basis of at least one of the light emission instruction, the control signal outputted from the control circuit to the trigger circuit, and the trigger signal outputted from the trigger circuit to said lamp.

12. A smoke detecting apparatus as claimed in claim 7 wherein said storage means includes a nonvolatile storage which can be electrically rewritten.

* * * * *